United States Patent [19]

Ichimura et al.

[11] Patent Number: 5,021,505

[45] Date of Patent: Jun. 4, 1991

[54] PHOTOSENSITIVE POLY(VINYL ALCOHOL) DERIVATIVE

[75] Inventors: Kunihiro Ichimura, Tsukuba; Noriaki Tochizawa; Hideo Kikuchi, both of Funabashi, all of Japan

[73] Assignees: Director General of the Agency of Industrial Science and Technology; Toyo Gosei Kogyo Co., Ltd., both of Japan

[21] Appl. No.: 444,626

[22] Filed: Dec. 1, 1989

[30] Foreign Application Priority Data

Dec. 14, 1988 [JP] Japan .................................. 63-313680

[51] Int. Cl.[5] .............................................. C08F 8/00
[52] U.S. Cl. ......................................... 525/59; 525/61
[58] Field of Search .................................... 525/59, 61

[56] References Cited

U.S. PATENT DOCUMENTS

Re. 27,922  2/1974  Heseltine et al. ................... 96/35.1

FOREIGN PATENT DOCUMENTS 261981   3/1988  European Pat. Off. .
2030575  4/1980  United Kingdom ................ 525/56

Primary Examiner—Joseph L. Schofer
Assistant Examiner—J. M. Reddick
Attorney, Agent, or Firm—Jordan B. Bierman

[57] ABSTRACT

A photosensitive poly(vinyl alcohol) derivative comprising units of the formula

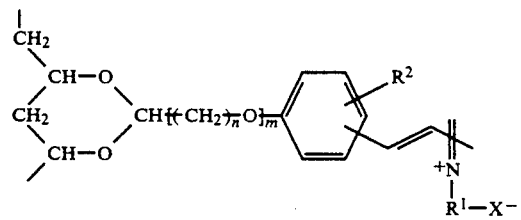

wherein $R_1$ is alkylene, $R_2$ is hydrogen or a lower alkoxy,

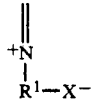

is a quaternary aromatic nitrogen-containing heterocycle, $X^-$ is $SO_3^-$ or $CO_2^-$, m is 0 or 1, and n is an integer of 1 to 6 capable of being developed with an aqueous developing solution.

5 Claims, 6 Drawing Sheets

PHOTOSENSITIVE POLY(VINYL ALCOHOL) DERIVATIVE

FIELD OF THE INVENTION

This invention relates to a novel photosensitive poly(vinyl alcohol) derivative, more specifically, to a highly sensitive, water-soluble photosensitive poly(vinyl alcohol) derivative which is developable with an aqueous developing solution, has good water resistance, and does not undergo coloring on heating.

BACKGROUND OF THE INVENTION

Heretofore, natural proteins such as gelatin, casein, egg albumen, and glue, mixed with a bichromate salt have been used as water-soluble photosensitive resins. However, these natural proteins have problems in that it is difficult to obtain resins of consistently stable quality, and the use of the bichromate salt may cause a pollution problem. Furthermore, photosensitive resins comprising these natural proteins and the bichromate salt are inferior in storage stability and undergo a dark reaction.

As photosensitive agents that eliminate such problems, photosensitive poly(vinyl alcohols) which have a pendant styrylpyridinium or styrylquinolinium photosensitive group have been proposed (Japanese Patent Publication No.56-5761/1981, Japanese Patent Publication No.56-5762/1981, Japanese Patent Publication No.56-11906/1981). These photosensitive poly(vinyl alcohols), which have good storage stability and high sensitivity, have been said to be suitable as photosensitive resins for use in screen printing (Japanese Patent Publication No.56-40814/1981), lithographic and relief printing (Japanese Patent Publication Laid-open No.62-25750/1987), press correction (Japanese Patent Publication Laid-open No.61-186954/1986, Japanese Patent Publication Laid-open No.61-186955/1986), photosensitive films (Japanese patent publication Laid-open No.55-135834/1980, Japanese patent Publication Laid-open No.61-175639/1986), production of color filters (Japanese Patent Publication Laid-open No.59-2039/1984, Japanese Patent Publication Laid-open No.60-129738/1985, Japanese Patent publication Laid-open No.60-129742/1985), production of cathode ray tube phosphor faces (Japanese Patent Publication Laid-oPen No.56-147804/1981, Japanese Patent Publication Laid-open No.58-164677/1983, Japanese Patent Publication Laid-open No.59-11388/1984), binders or overcoating layers for thermal recording materials (Japanese Patent Publication Laid-open No.62-257881/1987, Japanese Patent Publication Laid-open No.62-257882/1987), starching agents for textiles (Japanese Patent Publication Laid-open No.57-133276/1982), or immobilization of biocatalysts (Japanese Patent Publication No.56-54155/1981, Japanese Patent Publication No.58-30035/1983, Japanese Patent Publication Laid-open No.58-129976/1983).

However, the above prior art photosensitive poly(vinyl alcohols) have been defective, among others, in that they tend to undergo coloring when heated, and thus have been insufficient for use in the above applications. Especially for the production of color filters, the resins themselves undergo coloring due to heat applied in hardening of protective films, heat treatment of oriented films or sealants, or deposition of transparent electrodes, thus considerably deteriorating the spectral characteristics of the color filters.

SUMMARY OF THE INVENTION

With a view to eliminate the above prior art problems, it is a primary object of the present invention to provide a photosensitive poly(vinyl alcohol) derivative which is developable with an aqueous developing agent such as water or a mixture of water and an organic solvent, has good water resistance, does not undergo coloring by heating, and suitable for use in screen printing plates, lithographic printing plates, proof materials, color filters, binders or overcoating layers for thermal recording materials and immobilization of biocatalysts.

To develop a photosensitive resin that has the above advantageous properties, the inventors of the present subject matter have conducted intensive research and have found that a poly(vinyl alcohol) derivative which has a pendant styrylpyridinium, styrylquinolinium, or styrylbenzothiazolium group with a betaine structure attains the above object, based on which has been completed the present invention.

In accordance with the present invention which attains the above object, there is provided a photosensitive poly(vinyl alcohol) derivative comprising units of Formula (I)

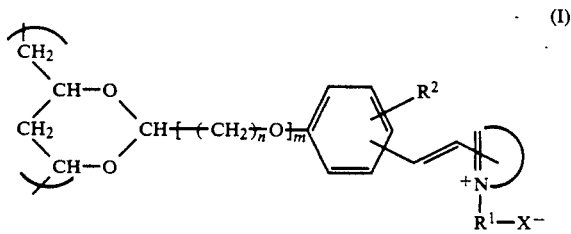

wherein $R_1$ is alkylene of 1 to 8 carbon atoms, preferably 1 to 6 carbon atoms, $R_2$ is hydrogen or alkoxy of 1 to 8 carbon atoms, preferably 1 to 6 carbon atoms,

is a quaternary aromatic nitrogen-containing heterocycle, $X-$ is $SO_3-$ or $CO_2-$, m is o or 1, and n is an integer of 1 to 6.

It is specifically preferable that in the poly(vinyl alcohol) derivative of Formula (I),

is a quaternary salt derived from pyridine, quinoline, or benzothiazole wherein $R_1$ and $X-$ have the same meanings as above.

DETAILED DESCRIPTION OF THE INVENTION

The present invention will now be described in detail.

The inventive poly(vinyl alcohol) derivative having units of Formula (I) is produced by reacting a poly(vinyl alcohol) with a styryl compound of Formula (II) or Formula (III), normally in an aqueous medium in the presence of an acid catalyst,

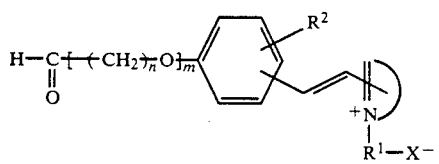
(II)

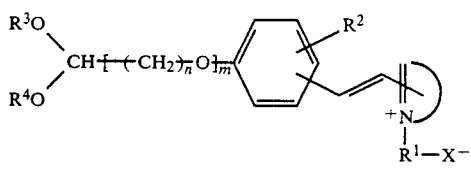
(III)

wherein $R_3$ and $R_4$ are individually alkyl of 1 to 8 carbon atoms, preferably 1 to 6 carbon atoms, or both of $R_3$ and $R_4$ form an alkylene of 2 to 8 carbon atoms, preferably 2 to 4 carbon atoms,

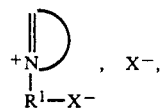

and m and n have the same meanings as above.

The compound of Formula (II) or Formula (III) is produced by reacting a styryl compound of the general formula

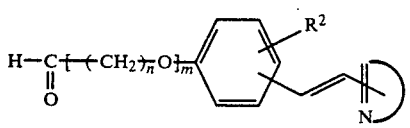
(IV)

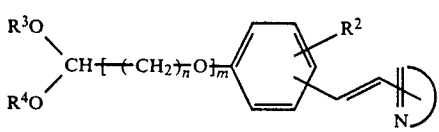
(V)

with a compound of the general formula

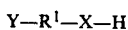
Y—R¹—X—H    (VI)

wherein Y is a halogen atom such as chlorine, bromine, or iodine, or the general formula

(VII)

wherein Z denotes $SO_2$ or CO, or by reacting a benzaldehyde derivative of the general formula

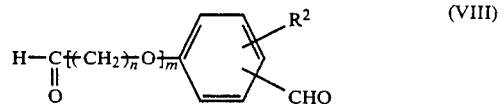
(VIII)

or the general formula

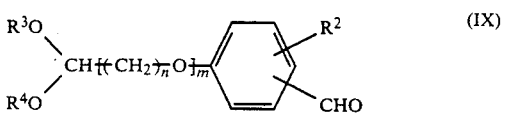
(IX)

with a nitrogen-containing heterocyclic compound having a betaine structure of the general formula

(X)

The nitrogen-containing heterocyclic compound preferably is pyridine, quinoline, or benzothiazole, or can be one which has a nucleus of thiazole, isothiazole, benzoxazole, pyrimidine, pyridazine, or pyrazine, or these rings may be substituted with alkyl, halogen, alkoxy, or carbamoyl.

poly(vinyl alcohols) that are reacted with a compound of Formula (II) or (III) include fully hydrolyzed poly(vinyl alcohols), partially hydrolyzed poly(vinyl alcohols) of 60 to 99% hydrolysis, and modified poly(vinyl alcohols) which are modified with hydrophilic, lipophilic, anionic, or cationic groups. The degree of polymerization of these poly(vinyl alcohols) is preferably 200 to 5,000.

When these poly(vinyl alcohols) are reacted with a compound of Formula (II) or (III) in the presence of an acid catalyst, an aldehyde such as formaldehyde, acetaldehyde, propionaldehyde, butyraldehyde, or benzaldehyde, or acetals thereof can be reacted simultaneously.

The introduction ratio of the photosensitive group including nitrogen-containing heterocyclic ring to the poly(vinyl alcohols) is preferably 0.5 to 20 mole % per monomer unit.

The following examples are intended to illustrate, not limit, the invention.

SYNTHESIS EXAMPLE 1

Synthesis of Compound (1)

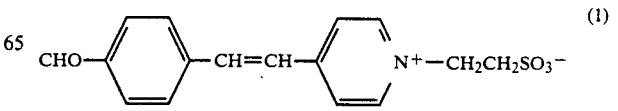
(1)

20 g of p-formylstyrylpyridine and 35 g of sodium β-bromoethanesulfonate were dissolved in 400 ml of N,N-dimethylformamide, and the solution was heated at 130 to 135° C. for 3 hours under stirring to deposit crystals. The crystals were hot-filtered off, and 400 ml of methanol were added to the filtrate to obtain yellow crystals. The yellow crystals were recrystallized from a water-methanol mixture.

The recrystallized product was confirmed to be Compound (1) from its spectral data.

Ultraviolet absorption spectra:
$\lambda_{max}$: 346 nm
$\epsilon_{max}$: 42550.

Figure 1:
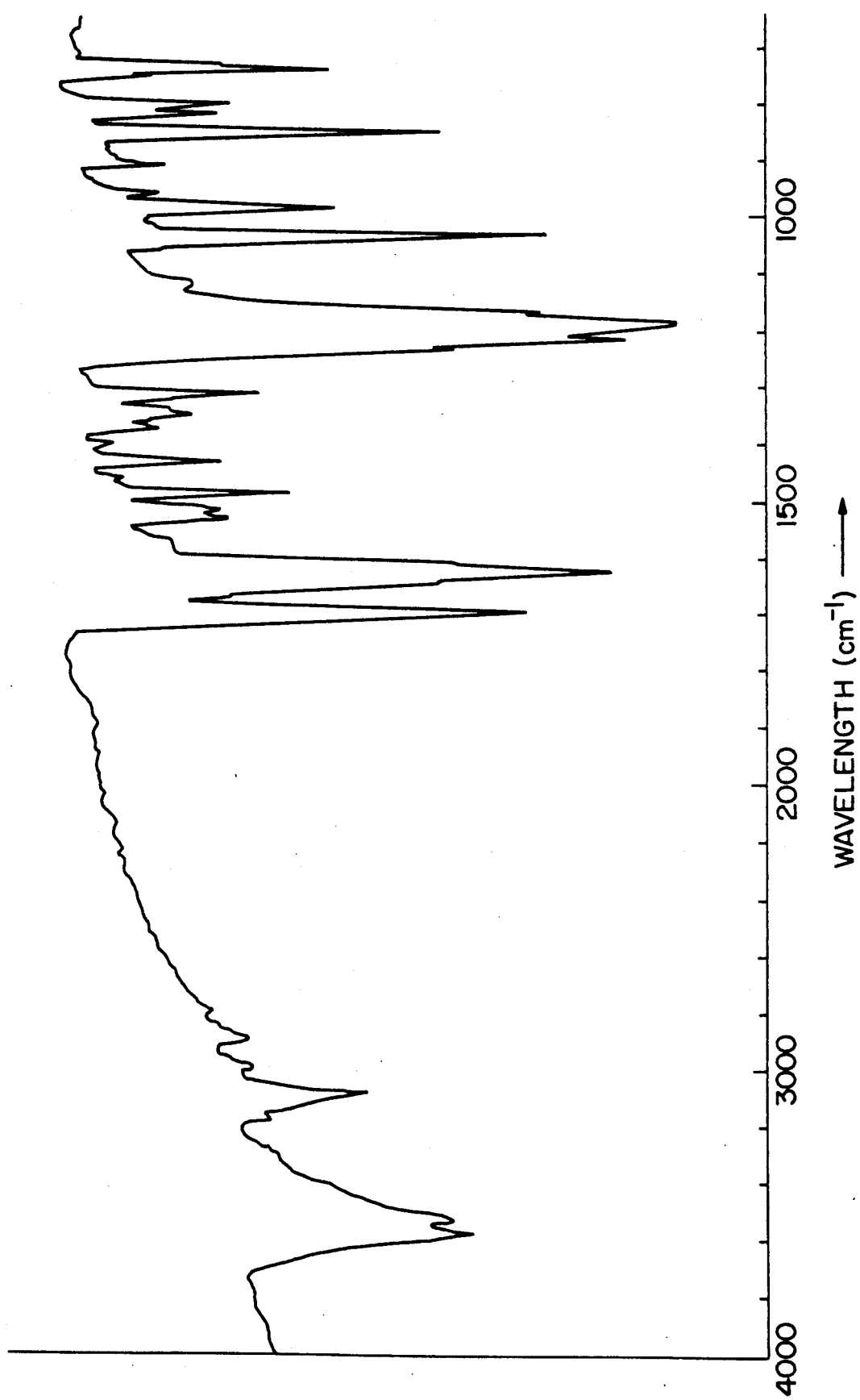
FIG.1 is an infrared absorption spectra of Compound (1) of Example 1.

Infrared absorption spectra: See FIG. 1.
Nuclear magnetic resonance spectra:
(in deuterio-dimethylsulfoxide)
3.15 ppm (triplet, 2H)
4.80 ppm (triplet, 2H)
7.65–8.05 ppm (multiplet, 6H)
8.10–9.0 ppm (quartet, 4H)
9.95 ppm (singlet, 1H)

EXAMPLE 1

5 g of poly(vinyl alcohol) EG-30 (from Nippon Synthetic Chemical Industry, polymerization degree: 1,700, hydrolysis: 88%) were dissolved in a mixture of 62g of water and 18 g of isopropyl alcohol.

This solution was mixed with 0.80 g of Compound (1) obtained in Synthesis Example 1 and 0.30 g of 85% phosphoric acid, and stirred at 35° to 40° C. for 20 hours. The reaction mixture was poured into acetone to deposit a white polymer.

The deposited polymer was thoroughly washed with methanol and vacuum-dried to obtain 4.62 g of a poly(vinyl alcohol) derivative.

Figure 2:
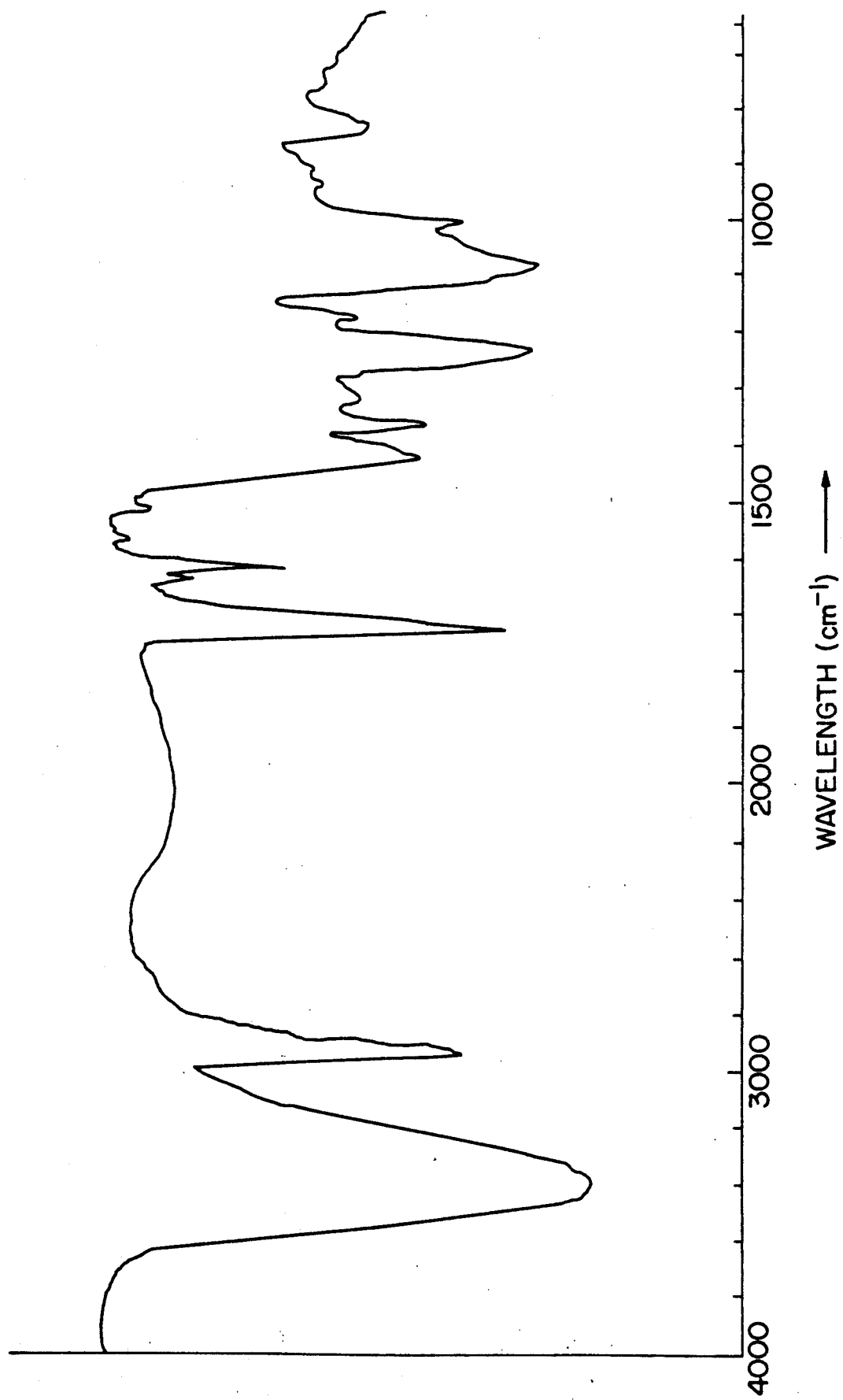
FIG. 2 is an infrared absorption spectra of poly(vinyl alcohol) derivative (A) of Example 1.

This poly(vinyl alcohol) derivative was confirmed to be poly(vinyl alcohol) derivative (A) from its infrared absorption spectral data (FIG. 2).

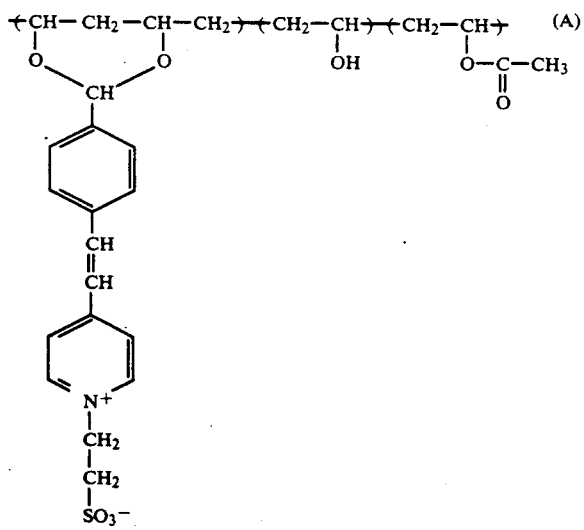

The amount of styrylpyridinium compound bonded to the poly(vinyl alcohol), determined by means of ultraviolet spectrophotometry, was 1.1 mole %.

3.9 g of poly(vinyl alcohol) derivative (A) obtained above were dissolved in a mixture of 55 g of water and 18 g of isopropyl alcohol, and the solution was mixed with Emulgen 913 (surfactant: from Kao) to obtain a photosensitive resin solution.

Figure 3:
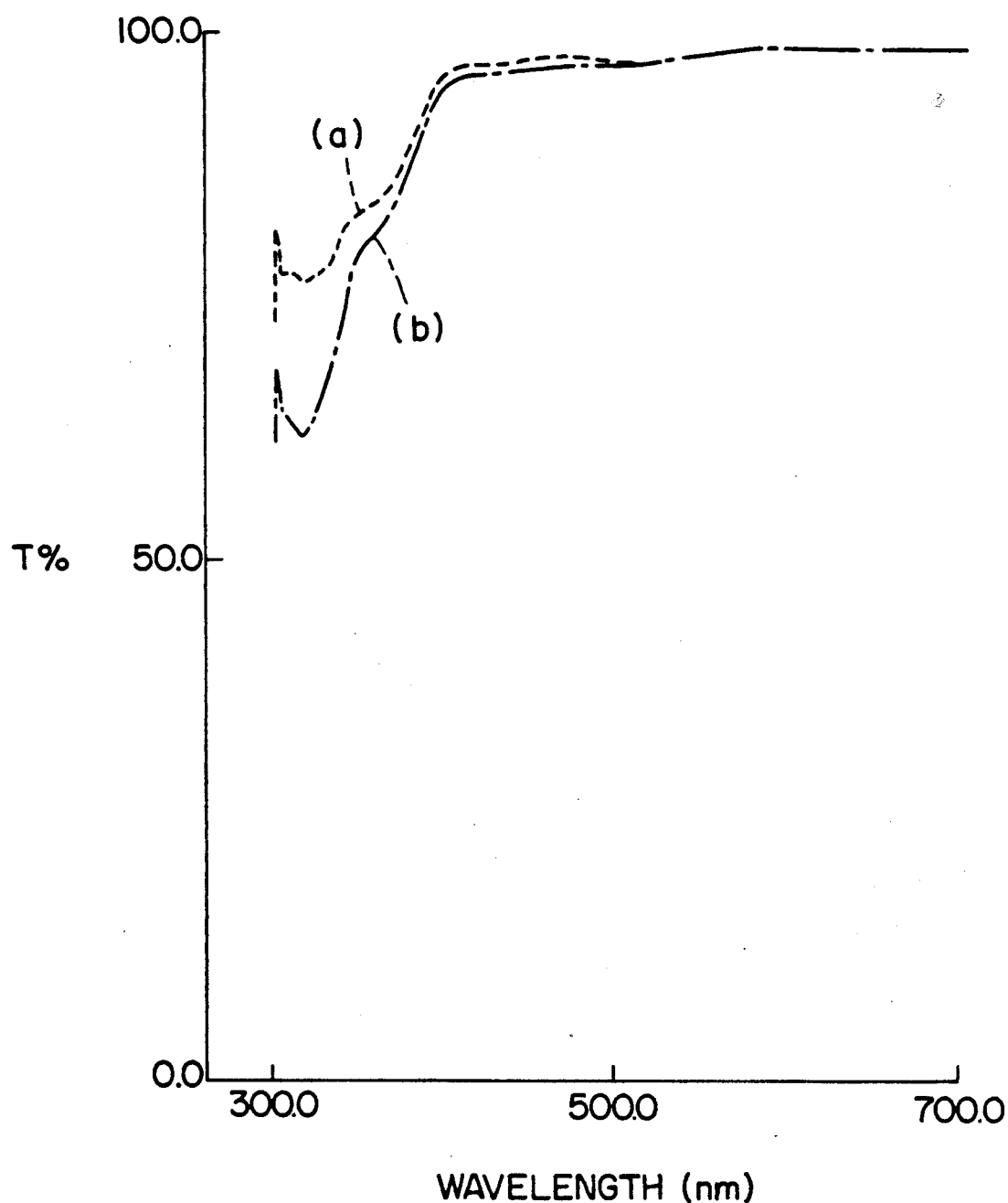
FIG. 3 is an absorption spectra of the photosensitive poly(vinyl alcohol) derivative of Example 1 after heating ((a) heated at 180° C. for 1.5 hours, (b) heated at 200° C. for 1 hour).

The thus obtained photosensitive resin solution was spin-coated onto a glass plate. The film thickness was 0.9μm after drying at 70° C. for 20 minutes. The film was then exposed by a 500-W ultra-high-pressure mercury lamp for 5.0 seconds. The thin films of the resin were heated under the following conditions.
(a) at 180° C. for 1.5 hours
(b) at 200° C. for 1 hour The thin films were measured individually for absorption spectra at 300 nm to 700 nm in wavelength. The absorption spectra obtained are shown in FIG. 3.

REFERENCE EXAMPLE

According to the method described in Japanese Patent Publication Laid-open No.55-23163/1980, poly(vinyl alcohol) EG-30 (from Nippon Synthetic Chemical Industry, polymerization degree: 1,700, hydrolysis: 88%) was combined with 1.1 mole % of N-methyl-4-formylstyrylpyridinium methosulfate to obtain poly(vinyl alcohol) derivative (B).

The thus obtained poly(vinyl alcohol) derivative was dissolved in water to prepare a photosensitive resin solution.

The photosensitive resin solution was coated on a glass plate as in the above Example, to a dry film thickness of 0.9μm.

The film was exposed by a 500-W ultra-high-pressure mercury lamp for 5.0 seconds.

Figure 4:
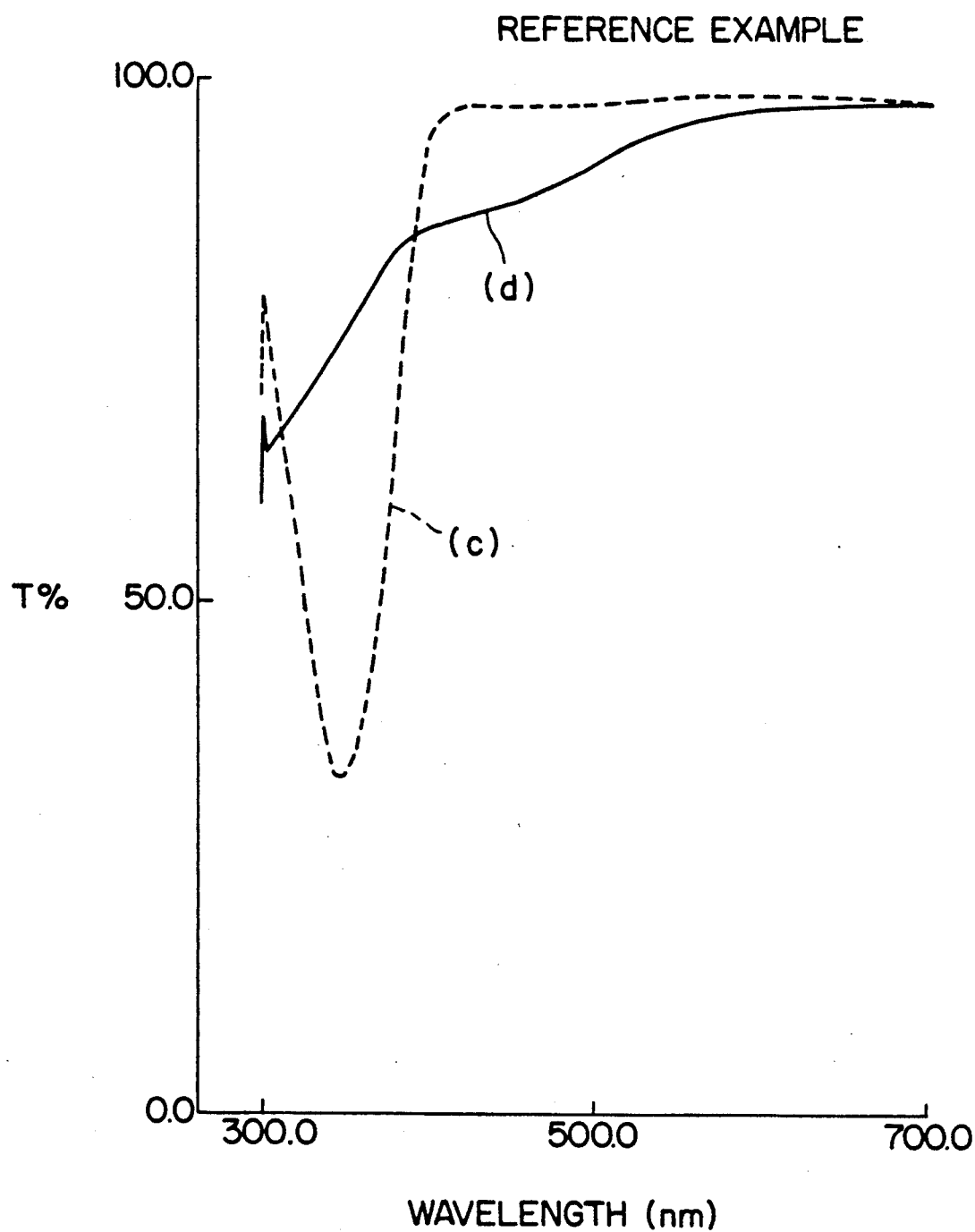
FIG. 4 is an absorption spectra of the photosensitive poly(vinyl alcohol) derivative of the Reference Example before heating (c) and after heating (d) (heated at 180° C. for 1.5 hours).

The exposed thin film was measured for absorption spectra at 300 nm to 700 nm in wavelength (FIG. 4 (c)).

The thin film was then heated at 180° C. for 1.5 hours and measured for absorption spectra at 300 nm to 700 nm in wavelength (FIG. 4 (d)).

Next, the thin films obtained in Example (conditions (a) and (b)) and the thin film (d) obtained in Reference Example were measured for transmittance at wavelengths of 420 nm, 460 nm, and 500 nm, respectively.

The results are shown in Table 1.

TABLE 1

| | | Transmittance (%) | | |
|---|---|---|---|---|
| | | 420 nm | 460 nm | 500 nm |
| Example 1 | (a) Heated at 180° C. for 1.5 hours | 97.0 | 98.0 | 97.3 |
| | (b) Heated at 200° C. for 1 hour | 96.1 | 97.1 | 97.3 |
| Ref. Example | (c) Heated at 180° C. for 1.5 hours | 88.0 | 90.0 | 92.9 |

As can be seen from Table 1, FIG. 3 and FIG. 4, the inventive photosensitive poly(vinyl alcohol) derivative is higher in transmittance after heating than the photosensitive poly(vinyl alcohol) derivative of Reference Example. Especially, as shown in absorption curve (b) in FIG. 3, the inventive derivative, even with a higher heating temperature of condition (b) (200° C., 1 hour), is higher in transmittance at wavelengths of over 400 nm than the derivative of Reference Example (FIG. 4 (d), 180° C., 1.5 hours).

The photosensitive poly(vinyl alcohol) derivatives of Example and Reference Example were equivalent in sensitivity, measured by means of a step tablet method.

SYNTHESIS EXAMPLE 2

Synthesis of Compound (2)

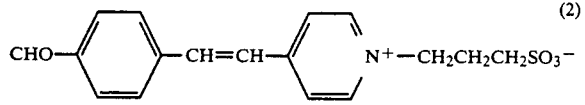

15 g of p-formylstyrylpyridine and 9.60 g propane sultone were dissolved in 100 ml of ethyl acetate, and the solution was heated at reflux temperature for 10 hours under stirring to deposit yellow crystals. The thus obtained yellow crystals were recrystallized from a water-methanol mixture.

The recrystallized product was confirmed to be Compound (2) from its spectral data.

Ultraviolet absorption spectra:

$\lambda_{max}$: 346 nm $\epsilon_{max}$: 40714

Figure 5:
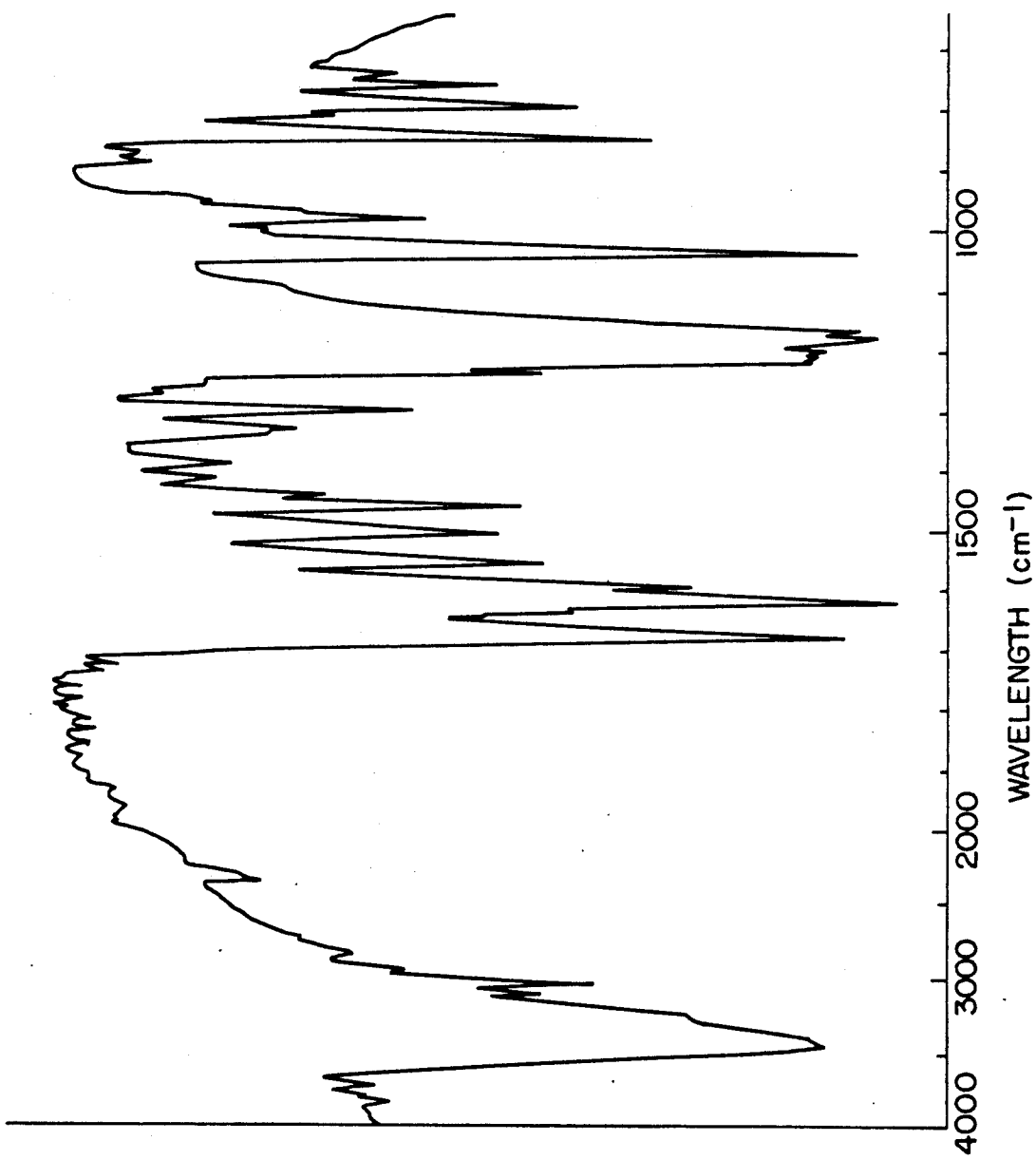
FIG. 5 is an infrared absorption spectra of Compound (2) of Example 2.

Infrared absorption spectra: See FIG. 5.

Nuclear magnetic resonance spectra:

(in deuterio-dimethylsulfoxide)

2.06–2.83 ppm (multiplet, 4H)

4.62 ppm (triplet, 2H)

7.65–8.05 ppm (multiplet, 6H)

8.10–9.0 ppm (quartet, 4H)

9.95 ppm (singlet, 1H)

EXAMPLE 2

5 g of poly(vinyl alcohol) EG-30 (from Nippon Synthetic Chemical Industry, polymerization degree: 1,700, hydrolysis: 88%) were dissolved in a mixture of 62 g of water and 18 g of isopropyl alcohol.

This solution was mixed with 0.84 g of Compound (2) obtained in Synthesis Example 2 and 0.30 g of 85% phosphoric acid, and stirred at 35° to 40° C. for 20 hours. The reaction mixture was poured into acetone to deposit a white polymer.

The deposited polymer was thoroughly washed with methanol and vacuum-dried to obtain 4.72 g of a poly(vinyl alcohol) derivative.

Figure 6:
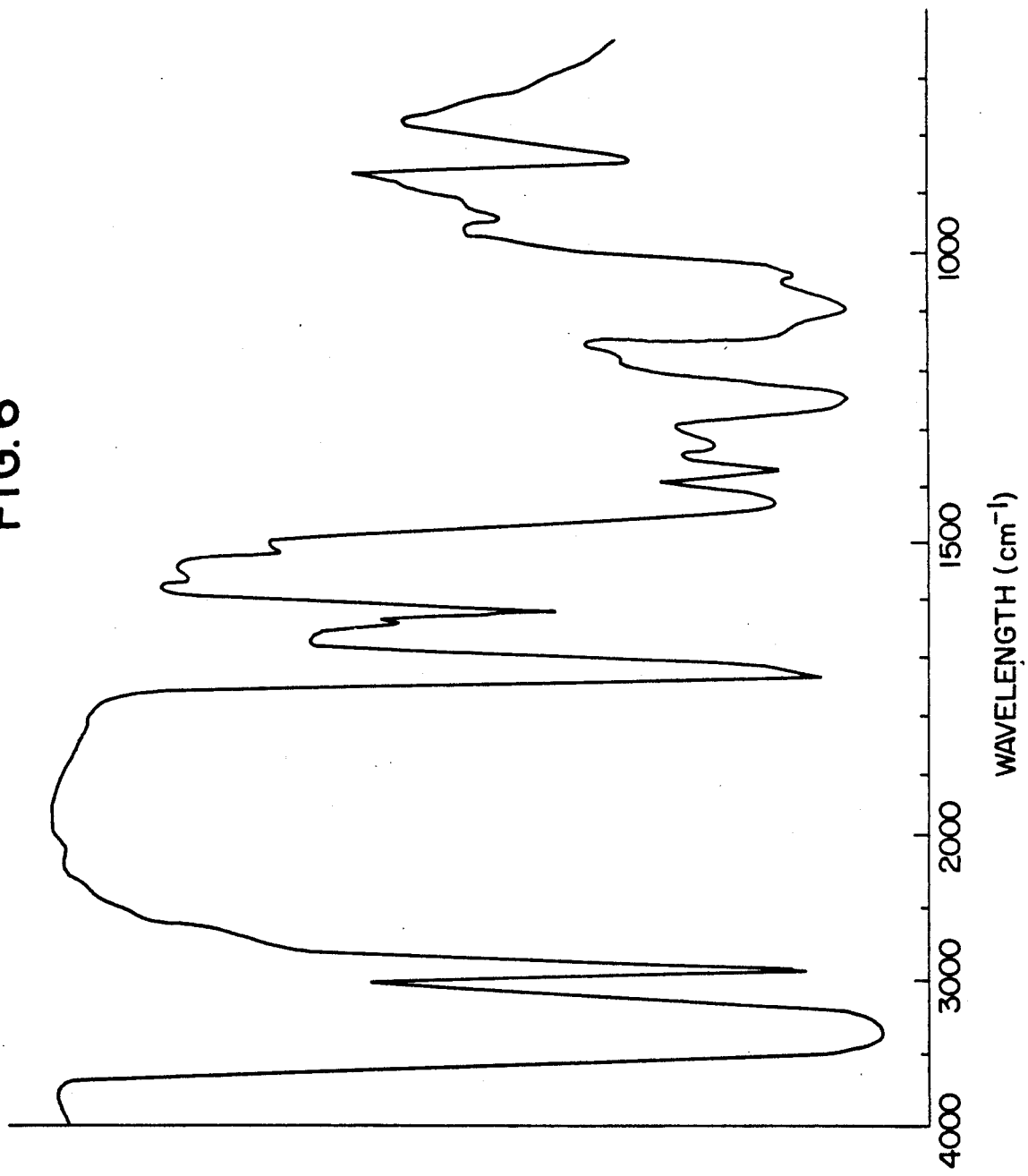
FIG. 6 is an infrared absorption spectra of poly(vinyl alcohol) derivative (C) of Example 2.

This was confirmed to be poly(vinyl alcohol) derivative (C) from its infrared absorption spectral data (FIG. 6).

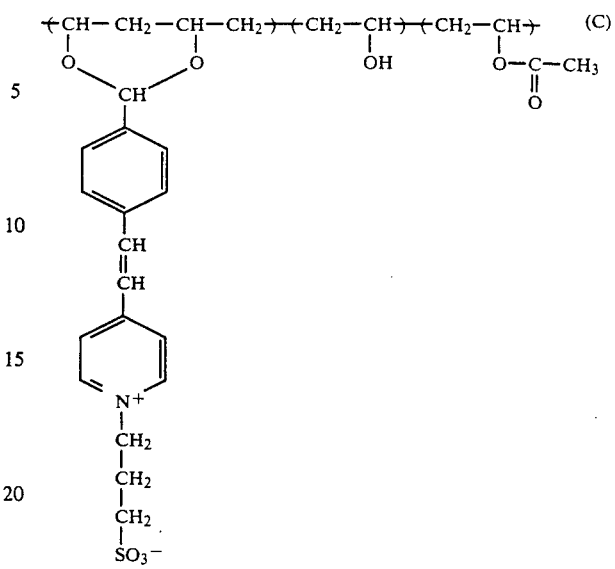

The amount of styrylpyridinium compound bonded to the poly(vinyl alcohol), determined by means of ultraviolet spectrophotometry, was 1.1 mole %.

3.9 g of poly(vinyl alcohol) derivative (C) obtained above were dissolved in a mixture of 55 g of water and 18 g of isopropyl alcohol, and the solution was mixed with Emulgen 913 (surfactant: from Kao) to obtain a photosensitive resin solution.

The thus obtained photosensitive resin solution was spin-coated onto a glass plate. The film thickness was 0.9 μm after drying at 70° C. for 20 minutes. The film was then exposed by a 500-W ultra-high-pressure mercury lamp for 5.0 seconds. The resin thin film was heated at 180° C. for 1.5 hours.

The heated thin film was measured for transmittances at 420 nm, 460 nm, and 500 nm, respectively.

The results are shown in Table 2.

TABLE 2

| | | Transmittance (%) | | |
|---|---|---|---|---|
| | | 420 nm | 460 nm | 500 nm |
| Example 2 | Heated at 180° C. for 1.5 hours | 95.0 | 96.5 | 96.5 |

As can be seen from the results shown in Table 2, the inventive photosensitive poly(vinyl alcohol) derivative is higher in transmittance after heating than the photosensitive poly(vinyl alcohol) derivative of Reference Example shown in Table 1.

The photosensitive poly(vinyl alcohol) derivatives of Example 2 and Reference Example were equivalent in sensitivity, measured by means of a step tablet method.

(Measurement of Water Resistance)

The photosensitive resin compounds obtained in Example 2 and Reference Example were individually mixed with a poly(vinyl acetate) emulsion (Mowinyl MA6, from Hoechst Gosei) in a solid ratio of 1:Z to obtain photosensitive emulsions for screen printing. The emulsions were individually coated using a stainless steel bucket onto a 250 mesh Tetoron screen mounted to an aluminum frame, and then dried. This procedure was repeated to form photosensitive films of 15 μm in thickness. The photosensitive films were then exposed by a 2-kW ultra-high-pressure mercury lamp at a distance of 60 cm for 3 minutes. The exposed films were cut into 10×10 cm², and each film was weighed. The films were dipped overnight in water, wiped to remove water from the surface, and then each film was weighed in the wet state. The films were then dried and weighed to determine the dissolution loss. The results of swelling rate and dissolution loss are shown in Table 3.

As can be seen from Table 3, the photosensitive compound according to the present invention has good water resistance.

TABLE 3

| | Swelling rate (wet wt./dry wt.) × 100 | Dissolution loss rate (dissol. loss/dry wt.) × 100 |
|---|---|---|
| Photosensitive emulsion of Reference Example | 175% | 4.6% |
| Photosensitive emulsion of Example 2 | 138% | 1.4% |

We claim:

1. A photosensitive poly(vinyl alcohol) derivative comprising units of the formula

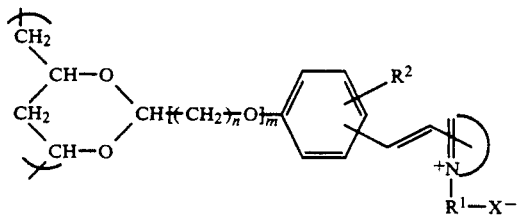

wherein $R_1$ is alkylene of 1 to 8 carbon atoms, $R_2$ is hydrogen or alkoxy of 1 to 8 carbon atoms,

is a quaternary aromatic nitrogen-containing heterocycle, $X^-$ is $SO_3^-$ or $CO_2^-$, m is 0 or 1, and n is an integer of 1 to 6.

2. A derivative of claim 1 wherein

is a quaternary salt derived from pyridine, quinoline, or benzothiazole, $R_1$ and $X^-$ having the same meanings as in claim 1.

3. A derivative of claim 1 wherein $R_1$ is alkylene of 1 to 6 carbon atoms.

4. A derivative of claim 1 wherein $R_2$ is hydrogen or alkoxy of 1 to 6 carbon atoms.

5. A derivative of claim 1 wherein the quaternary aromatic nitrogen heterocycle is selected from the group consisting of pyridine, quinoline, benzothiazole, and a heterocycle with a nucleus of thiazole, isothiazole, benzoxazole, pyrimidine, pyridazine or pyrazine unsubstituted or substituted with alkyl halogen, alkoxy or carbamoyl.

* * * * *

UNITED STATES PATENT AND TRADEMARK OFFICE
CERTIFICATE OF CORRECTION

PATENT NO. : 5,021,505   Page 1 of 2
DATED : June 4, 1991
INVENTOR(S) : K. Ichimura, et al It is certified that error appears in the above-identified patent and that said Letters Patent is hereby corrected as shown below:

On the title page, In the Abstract, change:

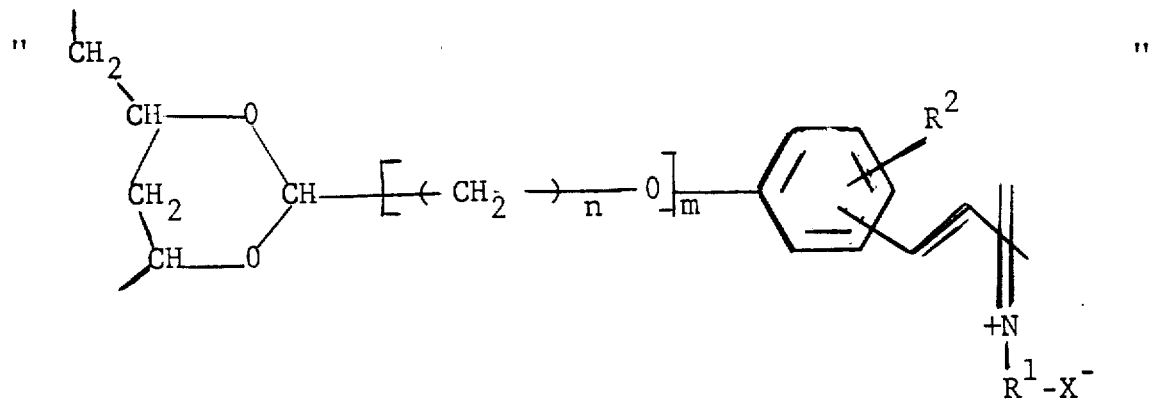

to

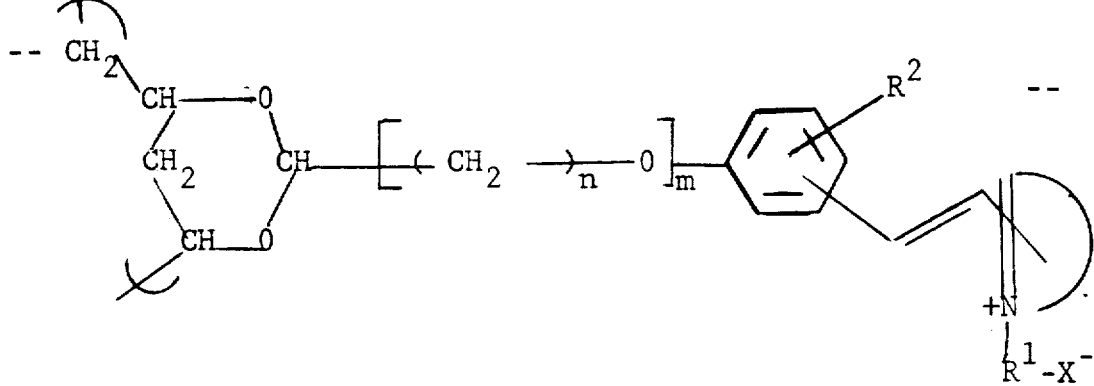

UNITED STATES PATENT AND TRADEMARK OFFICE
CERTIFICATE OF CORRECTION

PATENT NO. : 5,021,505                                         Page 2 of 2

DATED      : June 4, 1991

INVENTOR(S) : K. Ichimura, et al

It is certified that error appears in the above-identified patent and that said Letters Patent is hereby corrected as shown below:

In the Abstract, change :

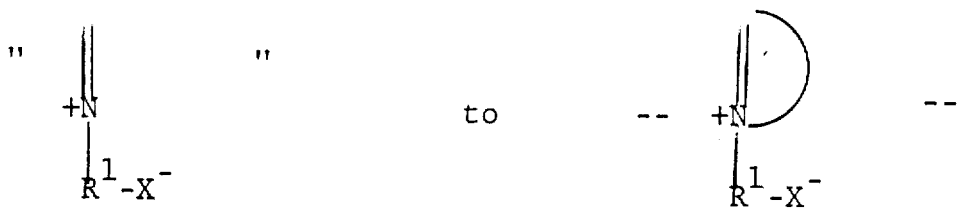

Signed and Sealed this

Sixth Day of April, 1993

Attest:

STEPHEN G. KUNIN

Attesting Officer          Acting Commissioner of Patents and Trademarks